US010789403B1

(12) United States Patent
Dureja et al.

(10) Patent No.: US 10,789,403 B1
(45) Date of Patent: Sep. 29, 2020

(54) GROUPING AND PARTITIONING OF PROPERTIES FOR LOGIC VERIFICATION

(71) Applicant: International Business Machines Corporation, Armonk, NY (US)

(72) Inventors: Rohit Dureja, Ames, IA (US); Jason Raymond Baumgartner, Travis, TX (US); Alexander Ivrii, Haifa (IL); Robert Kanzelman, Rochester, MN (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 16/411,193

(22) Filed: May 14, 2019

(51) Int. Cl.
*G06F 30/327* (2020.01)
*G06F 9/50* (2006.01)
*G06F 17/16* (2006.01)

(52) U.S. Cl.
CPC .......... *G06F 30/327* (2020.01); *G06F 9/5061* (2013.01); *G06F 17/16* (2013.01)

(58) Field of Classification Search
USPC ....................................................... 716/104
See application file for complete search history.

(56) References Cited

U.S. PATENT DOCUMENTS

| 7,237,210 | B2 | 6/2007 | Likovich, Jr. et al. |
| 7,844,929 | B2 | 11/2010 | Chaturvedula et al. |
| 8,689,155 | B1 | 4/2014 | Galpin |
| 9,529,963 | B1 | 12/2016 | Wilson |
| 9,690,888 | B2 | 6/2017 | Lu et al. |
| 10,242,135 | B2 | 3/2019 | Joshi et al. |
| 2005/0283744 | A1* | 12/2005 | Mochizuki ............... G06F 30/33 716/104 |
| 2007/0234247 | A1 | 10/2007 | Pritchard et al. |
| 2008/0256404 | A1* | 10/2008 | Funatsu ......... G01R 31/318342 714/724 |
| 2009/0064063 | A1 | 3/2009 | Kim et al. |
| 2009/0183129 | A1 | 7/2009 | Seigler et al. |

(Continued)

OTHER PUBLICATIONS

Kumpulainen et al.; "Anomaly Detection Algorithm Test Bench for Mobile Network", pp. 8.

(Continued)

*Primary Examiner* — Bryce M Aisaka
(74) *Attorney, Agent, or Firm* — Cantor Colburn LLP; Bryan Bortnick

(57) ABSTRACT

Embodiments of the invention are directed to a computer-implemented method of logic verification. The method includes obtaining a netlist of a circuit comprising a plurality of observable gates. A first observable gate is grouped together with a second observable gate based on a portion of a fan-in logic of the first observable gate being equal to a portion of a fan-in logic of the second observable gate. The group is expanded by including a third observable gate, based on a first strongly connected component (SCC) in the group having a similarity greater than a first threshold to a second SCC in the fan-in logic of the third observable gate. The group is further expanded by including a fourth observable gate, based on the distance of a portion of the fan-in logic of the fourth observable gate from a fan-in logic of at least one observable gate in the group of observable gates.

18 Claims, 13 Drawing Sheets

(56) References Cited

U.S. PATENT DOCUMENTS

2017/0169149 A1  6/2017  Kailas
2018/0365346 A1  12/2018  Freeman et al.
2019/0005177 A1  1/2019  Sharma et al.

OTHER PUBLICATIONS

Lewis, Jim; "Accelerating Verification Through Pre-Use of System-Level, Transaction-Based Testbench Components", DesignCon 2003. pp. 20.
Malik et al.; "Advanced Testbench Design Using Reusable Verification Component and OVM", International Journal of Computer Applications (0975-8887) vol. 73-No. 15, Jul. 2013. pp. 5.
Paruthi,Viresh; "Large-Scale Application of Formal Verification: From Fiction to Fact", pp. 6.

* cited by examiner

Support Bitvector Computation

```
support_bitvector(Property p, Netlist N)
{
  Bitvector bv;
  for each support Variable v in Netlist N
  {
    unsigned i = index(v); // index of corresponding bit in bitvector bv
    if(fanin(p) includes v)
      bv[i] = 1;
    else
      bv[i] = 0;
  }
  return bv;
}
```

FIG. 2

Support Size Computation

```
coi_size(Property p, Netlist N)
{
  unsigned sz = 0;
  Bitvector bv = support_bitvector(p, N);
  for each bit b in Bitvector bv
  {
    if(b == 1) {
      if(b represents a SCC s)
        sz = sz + weight(s);
      else
        sz = sz + 1;
    }
  }
  return sz
}
```

FIG. 3

Main Property Grouping Procedure

```
property_grouping(Properties P, Netlist N, Level l, Threshold t)
{
  Groups G = {}; // initially empty
  for each Property p in P
  {
    Group g = {};
    g.insert(p); // group contains only one property
    G.insert(g);
  }
  if(l >= 1)
    perform_grouping_level_1(G, N);
  if(l >= 2)
    perform_grouping_level_2(G, N, t, min_weight); // min_weight discussed below
  if(l >= 3)
    perform_grouping_level_3(G, N, t);
  return G;
}
```

FIG. 5

Level 1 Property Grouping based on Identical Support Bitvectors

```
perform_grouping_level_1(Groups G, Netlist N)
{
  Hash_function hfun;
  Hash_map hmap;
  for each Group g in G
  {
    Property p = g(0); // representative property in group g
    Bitvector bv = support_bitvector(p, N);
    unsigned val = hfun(bv); // hash the bitvector for fast comparison to others
    Group h = hash_lookup(hmap, <val, bv>) // check if another property has identical support bitvector bv.
    Note: val itself does not guarantee identical bv's
    if(Group h = hash_lookup(hmap, <val, bv>) // another group has identical support bitvector bv
    {
      group_merge(g, h); // merge properties in g with h
    }
    else {
      hash_insert(hmap, <<val, bv>, g>); // store in hash table for later comparison
    }
  }
}
```

FIG. 6

Level 2 Property Grouping based on Heavy-Weight Support SCCs

```
perform_grouping_level_2(Groups G, Netlist N, float t, unsigned min_weight)
{
  Trie trie = {}; // initially empty
  for each Group g in G
  {
    Property p = g(0); // representative property in group
    Bitvector bv = support_bitvector(p, N);
    Set S = find_sccs(bv, N, min_weight); // SCCs in support of property p with weight at least min_weight
    unsigned scc_weight = cumulative_weight(S); // weight of all SCCs in S
    unsigned coi_size = coi_size(p, N);
    if(scc_weight/coi_size < t) // SCCs contain less than t% of the support variables
    continue; // Common SCC support alone will not decide adequate affinity for this group
    if(Group h = trie_lookup(trie, S)) // another group has exact same SCCs in support
    {
      group_merge(g, h); // merge properties in g with h
    }
    else {
      trie_insert(trie, <S, g>); // store in trie for later comparison
```

FIG. 8

Approximate Clustering Algorithm Based on Hamming Distance

```
fuzzed_bitvector_clustering(Bitvectors BV, unsigned n, unsigned num)
{
  Set S = {0, 1, ..., 2^n - 1}; // all n-bit numbers
  Map m = cluster(S, num); // cluster n-bit numbers, based on Hamming distance, into
  "num" centers,
  and return a map from n-bit number to cluster number 1, ..., num
  Hash_function hfun;
  Hash_table ht; // table to maintain set of bitvectors with identical hash keys
  Clusters C = {}; // initially empty
  for each bitvector bv in BV
  {
    unsigned num_words = ceil(length(bv) / n) // number of n-bit words in bv
    unsigned mbv[num_words]; // mapped bitvector, computed below
    for i in 0 .. num_words-1 // analyze each n-bit sub-vector in bv
      mbv[i] = m[bv[i]]; // generated mapped support vector for n-bit word i of bv
    unsigned val = hfun(mbv);
    hash_insert_multi(ht, <<val>, bv>); // update hash table. If <val> already exists as a
    key in hash_table,
    add new <bv> value to this key
  }
  for each entry <<val>, bv[]> in ht
  {
    Cluster c = bv[]; // set of bitvectors with hash key <val>
    C.append(c);
  }
  return C;
}
```

FIG. 10

Level 3 Property Grouping based on Hamming Distance

```
perform_grouping_level_3(Groups G, Netlist N, float t)
{
unsigned n, num;
// The following can be done off-line for the desired set of thresholds t, and the
resulting "map"
embedded into a verification tool
choose_values(n, num, t); // determined experimentally
Set S = {0, 1, 2, ... ,2^n - 1}; // all n-bit numbers
Map m = cluster(S, num); // cluster items in S in to num clusters. Function returns
a map of items to
cluster number 1,...,num
Hash_function hfun;
Hash_map hmap;
Trie trie = {}; // initially empty
for each Group g in G
{
Property p = g(0); // representative property in group
Bitvector bv = support_bitvector(p, N);
unsigned num_words = ceil(length(bv) / n) // number of n-bit words in bv
unsigned mbv[num_words]; // mapped bitvector, computed below
// create mapped bitvector mbv using map m
for i in 0 .. num_words-1 // analyze each n-bit sub-vector in bv
mbv[i] = m[bv[i]]; // generated mapped support vector for n-bit word i of bv
unsigned val = hfun(mbv);
if(Group h = hash_lookup(hmap, <val>)
{
group_merge(g, h); // merge properties in g with h
}
else
{
hash_insert(hmap, <<val>, g>); // store in hash table for later comparison
trie_insert(trie, <mbv, g>); // store mapped bitvector in trie for optional post-
processing
}
}
// optional post-processing, for further grouping
unsigned allowed_to_differ = floor((1 - t) * number of support variables/n); //
number of n-bit segments
allowed to differ
for each mapped bitvector mbv in trie_contents(trie)
{
Group g = trie_lookup(trie, mbv); // get group corresponding to mapped support
bitvector
Groups H = trie_query(trie, mbv, allowed_to_differ); // return all groups for which
mapped support
bitvector differs
// in at most 'allowed_to_differ' segments with respect to mbv
for Group h in H
{
group_merge(g, h); // merge properties in g with h
trie_remove(trie, h); // remove mapped bitvector for group h from trie
}
trie_remove(trie, g);
}
}
```

FIG. 12

GROUPING AND PARTITIONING OF PROPERTIES FOR LOGIC VERIFICATION

BACKGROUND

The present invention generally relates to logic verification, and more specifically, to grouping and partitioning properties to improve logic verification.

In many verification contexts, the verification of a given hardware and/or software design mandates checking a large number of "properties," or verification objectives. For example, in "equivalence checking," each primary output of the designs being equivalence-checked is compared for pair-wise equality: this entails a distinct property per primary output. In functional verification, hardware designs typically have a large diversity of types of properties, ranging from low-level assertions (e.g., that the inputs to a "parallel case" statement are indeed mutually-exclusive, that an unexpected state machine state or transition is not reachable, that driver collisions cannot happen on an internal bus) to high level encompassing properties such as that an arbiter fairly grants requests of various priorities, and that certain input stimulus scenarios result in the specified output scenarios.

Verification generally entails exponentially-growing complexity with respect to the size of the design under verification, specifically with respect to the size of the "cone of influence" (COI) or fan-in logic of the signals referenced in the properties being verified. Each property will generally have a distinct minimal "cone of influence" of fan-in logic from the design under verification.

SUMMARY

Embodiments of the present invention are directed to a method for logic verification. A non-limiting example of the method includes obtaining a netlist of a circuit comprising a plurality of observable gates. A first observable gate is grouped together with a second observable gate based on a portion of a fan-in logic of the first observable gate being equal to a portion of a fan-in logic of the second observable gate. The group is expanded by including a third observable gate, based on a first strongly connected component (SCC) in the group having a similarity greater than a first threshold to a second SCC in the fan-in logic of the third observable gate. The group is further expanded by including a fourth observable gate, based on the distance of a portion of the fan-in logic of the fourth observable gate from a fan-in logic of at least one observable gate in the group of observable gates.

Other embodiments of the present invention implement the features of the above-described methods in computer systems and in computer program products.

Additional technical features and benefits are realized through the techniques of the present invention. Embodiments and aspects of the invention are described in detail herein and are considered a part of the claimed subject matter. For a better understanding, refer to the detailed description and to the drawings.

BRIEF DESCRIPTION OF THE DRAWINGS

The specifics of the exclusive rights described herein are particularly pointed out and distinctly claimed in the claims at the conclusion of the specification. The foregoing and other features and advantages of the embodiments of the invention are apparent from the following detailed description taken in conjunction with the accompanying drawings in which:

FIG. 2 depicts pseudocode for computing a support bit vector according to one or more embodiments of the present invention;

FIG. 3 depicts pseudocode for computing bit vector size according to one or more embodiments of the present invention;

FIG. 5 depicts pseudocode for leveled grouping according to one or more embodiments of the present invention;

FIG. 6 depicts pseudocode for level one grouping according to one or more embodiments of the present invention;

FIG. 8 depicts pseudocode for level two grouping according to one or more embodiments of the present invention;

FIG. 10 depicts pseudocode for a clustering method according to one or more embodiments of the present invention;

FIG. 12 depicts pseudocode for level three grouping according to one or more embodiments of the present invention.

Figure 1:
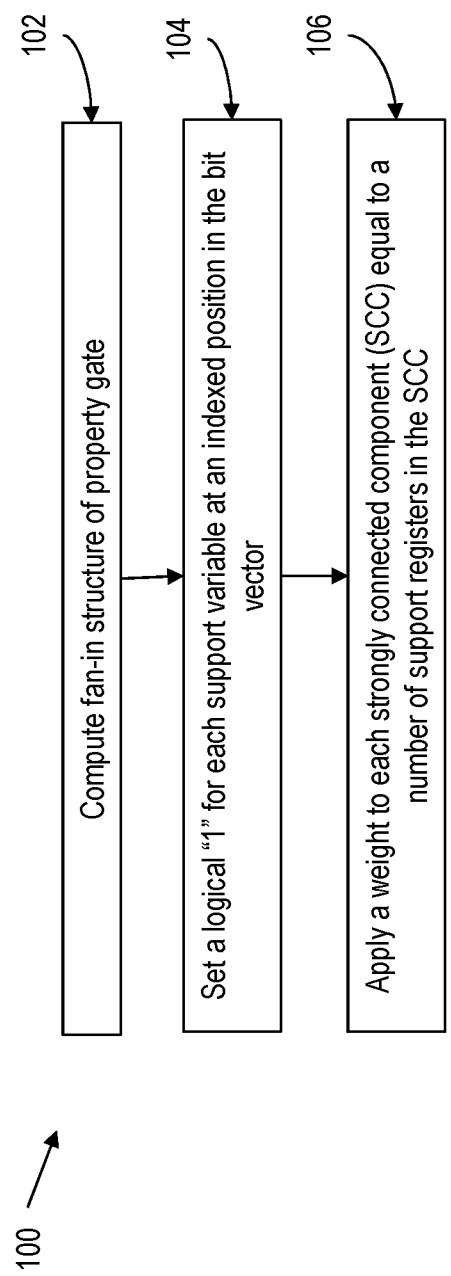
FIG. 1 depicts a flow diagram for computing a support bit vector according to one or more embodiments of the present invention.

The diagrams depicted herein are illustrative. There can be many variations to the diagrams or the operations described therein without departing from the spirit of the invention. For instance, the actions can be performed in a differing order or actions can be added, deleted or modified. Also, the term "coupled" and variations thereof describe having a communications path between two elements and do not imply a direct connection between the elements with no intervening elements/connections between them. All of these variations are considered a part of the specification.

In the accompanying figures and following detailed description of the disclosed embodiments, the various elements illustrated in the figures are provided with two or three digit reference numbers. With minor exceptions, the leftmost digit(s) of each reference number correspond to the figure in which its element is first illustrated.

DETAILED DESCRIPTION

Embodiments of the present invention relate to scalable logic verification techniques that group and partition properties based on structural affinity, i.e., properties that have a similar fan-in structure. This grouping is performed in three configurable levels based on identical bit vectors, weights of large strongly connected components (SCCs), and a distance between the bit vectors. The techniques provided herein are also applicable towards partitioning for logic synthesis, circuit placement and routing, and non-electronic design automation (EDA) applications.

Formal verification techniques, which can provide bounded or unbounded proofs of correctness, often directly encounter runtime exponential with respect to the "cone of influence" size of the properties being verified. Concurrent verification of multiple properties may be slower than one-at-a-time verification, in that each property of a "concurrently-solved group" may add unique fan-in logic to the collective "cone of influence" size of the group, thereby slowing the solution of each individual property.

Conversely, sometimes two or more properties share nearly-identical cones of influence. In these cases, concurrent verification of the high-affinity properties may save considerable collective verification resources, as the verification effort expended for one can be directly reused for the other without significantly slowing the verification of any property within the high-affinity group.

Conventional verification techniques need to specify the number of groups to create at the beginning of the process. This is difficult to achieve and usually entails repeating a potentially-expensive analysis with a range of "number of groups" until an acceptable result is achieved. Furthermore, conventional clustering algorithms require at least quadratic runtime with respect to the number of properties, which are often prohibitively slow. The benefits of these conventional clustering algorithms are often outweighed by the reduction in speed. Furthermore, conventional verification techniques result in concurrently verifying low-affinity properties, which severely hurts verification scalability. Merging low-affinity properties results in a larger fan-in logic, which in turn leads to verification algorithms having to unnecessarily verify the larger fan-in logic. Conversely, verifying N high-affinity properties one at a time leads to significant cumulative wasted runtime, since each of the N verification runs does virtually the same work.

A need, therefore, exists for an effective solution for determining which high-affinity properties should be partitioned into groups that should be independently verified. Furthermore, the solution must itself be highly-scalable, as the resources it consumes must be smaller than the effort saved in cumulative verification of all property groups to yield overall computational savings.

One or more embodiments of the invention address the above-described shortcomings of the prior art by providing systems and methods that use support bit vectors for a set of properties, and partitions them into high-affinity property groups that are amenable to concurrent verification per respective. The properties with similar bit vectors have a high structural affinity and are concurrently verified in one multi-property verification task with little slowdown. This is because the cone of influence of each property within a high-affinity group is virtually identical to that of the entire group, thus the verification effort spent on any property therein can likely directly be reused to more quickly solve the others without significant runtime overhead to any property therein. Embodiments of the present invention create a high-affinity property group that can be verified, thereby reducing the overall time required to perform the verification process.

An integrated circuit (IC) design can contain many sub-parts, which are further subdivided. After a schematic IC design is created in a computer-aided design program, it is output as a netlist. Netlists can be organized in a hierarchical form or a flat form. A flat data netlist contains multiple copies of the circuit modules without boundary descriptions found in hierarchical representations, which usually consist of module or cell instance names. For example, a flat data netlist will list one or more flat paths describing a string of components that are connected at the highest level in the circuit design hierarchy through a lowest component without hierarchical boundaries. In other words, a flat path is a path statement from a starting place, usually the highest point in that particular path, to a specified endpoint marker or either the lowest or bottom-most primitive component in a particular current or circuit path. The start or stop points can also be selected based upon a desire to test a segment within a larger circuit path.

The netlist format described herein is used to represent sequences of nodes under verification and contains a directed graph with gates represented as vertices, and interconnections between gates represented as edges. Every node has an associated function: constants, primary inputs, combinational logic such as AND gates, and sequential logic such as registers. Registers each have two associated gates that represent their next state function, and their initial-value function. Semantically, the value of the register at time "0" equals the value of the initial-value function gate at time "0", and the value of the register at time "i+1" equals that of the next-state function gate at time "i". The valuation of all registers represents a "state" of the system. A sequence of gate valuations represents a "trace".

Certain gates are labeled as "observable gates". Certain observable gates are labeled as "properties," formed through a standard synthesis of the relevant property specification language. In some embodiments, properties include "primary outputs" and/or other "endpoints" for logic synthesis, and each group of primary outputs and/or other endpoints is synthesized independently. The properties represent the verification objectives and can be of two types: "safety" and "liveness". For safety properties, the verification objective is to find a trace such that a logical "1" is asserted at the property gate or prove that no such trace exists. For liveness properties, the verification objective is to find a lasso-shaped trace wherein the property gate remains asserted forever, i.e., a "prefix" of states followed by a "suffix" loop of repeating states, wherein the property gate remain asserted at a logical "1" within the loop.

In performing verification, a verification engineer using a testbench imposes "input constraints" that represent assumptions made by the design about the behavior of adjacent logic to avoid bogus uninteresting property failures. Such input constraints (sometimes referred to as a "driver" or "environment") are synthesized and composed onto the netlist representing the design and its properties. This allows a flat netlist to represent the entire verification problem. To synthesize an environment, certain gates may be labeled as "constraints," in which every trace representing a possible "counterexample" to a property must evaluate every constraint to logical "1" at every timestep. For liveness verification, certain gates may be labeled as "fairness constraints" which must evaluate to logical "1" at least once in the repeating "lasso-loop" of any counterexample trace.

The fan-in logic of a property refers to the set of nodes in the netlist which may be reached through traversing the netlist edges backward from the property gate. The nodes include but are not limited to logic gates, registers, and primary inputs. This fan-in logic is sometimes called the "cone of influence" (COI) of the property, and the registers, primary inputs, array/RAM reference in the fan-in logic are called "support variables." Primary inputs are inputs received from a source external to the fan-in logic. Support variable information may be represented as an indexed array of Boolean values, or bit vector, per property, in which each "support variable" is assigned a unique index in this array, and a given bit of a bit vector associated with a property will be set precisely if that support variable is in the fan-in of that property gate. If support variable bit vectors are available for every property, one may analyze these bit vectors to determine "affinity" among the properties, in which high-affinity targets have nearly identical bit vectors. The similarity of the bit vectors can be determined by any numbers of measurement metrics and determined based on being under a threshold distance. In some embodiments of the present invention, the similarity is based on a Hamming distance between the bit vectors.

In some embodiments, a bit vector length is equal to the total number of support variables in the netlist. However, several optimizations are possible to reduce the bit vector length without losing affinity-comparison granularity. For example, a strongly connected component (SCC) in the netlist is a set of interconnected gates such that there is a directed path between every pair of gates in the same SCC. As used herein the SCC refers to a portion of the netlist, in which every logic gate is reachable from every other logic gate (vertices) by at least two paths (edges) with no logic gates in common except for the origin and destination. Not every gate in a netlist is part of a SCC. In a well-formed netlist, every directed cycle has at least one register, such that every SCC will contain at least one register. Since primary input gates have no incoming edges, input variables cannot be inside a non-singleton SCC. The "weight" of an SCC refers to the number of registers in that SCC. Every SCC may be represented as a single weighted support variable and given a single-bit support index, irrespective of its size. A bit of the bit vector is set to logical "1" precisely if the corresponding support variable or SCC is in the fan-in of the property gate.

As described above verification efficiency is increased by grouping of high-affinity properties and concurrently verifying the properties in each group. Initially, the process involves traversing a netlist to determining a fan-in logic of each property subject to verification. Each fan-in logic is described by an indexed bit vector, such that each register or primary input in the fan-in logic is represented by a logical "1", otherwise a logical "0". In some embodiments, a group of high affinity property properties are verified independent of other groupings.

Upon generation of the bit vectors for each property, the process undergoes a three-level process for grouping high-affinity properties. At the first level, each bit vector having a threshold similarity to another bit vector is grouped together. In some embodiments of the present invention, a bit vector has 100% similarity to each other bit vector in the group. At the second level, the process leverages SCC similarity to group properties together. In many instances, the SCC includes the majority of registers and inputs in a fan-in logic of influence, such that SCC is essentially the fan-in logic. Therefore, at level 2 the process detects the level of similarity between the SCCs of different fan-in logic and groups properties based on the level of similarity. At level three, the process groups together properties within a threshold Hamming distance from each other. However, due to a slower speed of directly computing a Hamming distance for every bit vector pair, a faster Hamming distance approximation is used. The resulting grouped properties have a high-affinity and their verification is faster than verification using conventional grouping methods. The above-referenced procedure is described in more detail below.

Referring to FIG. 1, a method 100 for computing a support bit vector is shown. FIG. 2 and FIG. 3 are pseudocode that describe basic helper functions to compute the support bit vector and the fan-in logic size and accompany FIG. 1. In some embodiments of the present invention, every support variable in a netlist is indexed to a unique position in the bit vector. The processor recursively computes the fan-in structure, or "cone of influence", of the gate corresponding to a property at block 102. If a support variable is in the fan-in of the property, then the i'th bit in the bit vector is set to logical "1" in the bit vector; otherwise, is set to logical "0" at block 104. To support SCCs using a single bit vector bit, function weight(s) returns the number of registers in the SCC at block 106. The fan-in logic size of the property equals the sum of the weighted bits set to logical "1", taking into account the weight of SCCs such that the implementation choice of whether to represent SCCs as a single bit vector bit does not affect the resulting support size.

The netlist may be traversed once in a topological manner, computing intermediate support bit vectors for internal gates. For example, for an AND gate a1 with incoming edges i1 and i2, the intermediate bit vector for a1 is simply the disjunction over the bit vectors for i1 and i2. Intermediate bit vectors may be de-allocated once all fan-outs have consumed their values to reduce overall memory, leaving only bit vectors allocated for property gates for later affinity analysis.

Initially, every property is in its own singleton group, and every group contains only one property. Grouping is performed at three levels 1, 2, and 3. The procedure also takes a desired minimum affinity threshold t as input for level 2 and 3 grouping. In some embodiments of the present invention, properties in a group are within a ((1−t)*number of support variables) Hamming distance with respect to a representative property in the group. In some embodiments of the present invention, each property is initially assigned its own distinct group, and threshold t=0.9 or 90. The Hamming distance is a metric suitable for determining a bit distance. It should be appreciated by one of ordinary skill in the art that other distance metrics aside from a Hamming distance can be applied.

Figure 4:
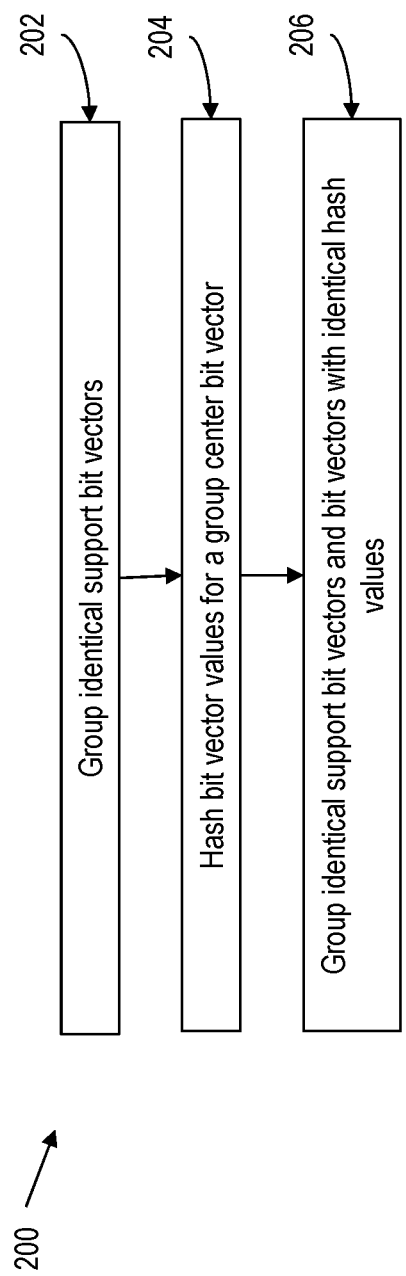
FIG. 4 depicts a flow diagram for level one grouping according to one or more embodiments of the present invention.

Referring to FIG. 4, a method 200 for performing level one property grouping based on identical support bit vectors is shown. FIG. 5 is pseudocode describing the overall three-level structure of grouping properties and accompanies FIG. 4. FIG. 6 is pseudocode describing the level 1 grouping method and accompanies FIG. 4. At block 202, the procedure takes an initial property grouping as input, and then merges groups that have identical support bit vectors. One property is designated the "group center". In some embodiments of the present invention, several properties are pre-grouped, in this instance, the pre-grouping may run relative to a representative therein, or optionally, relative to the cumulative support bit vector of every property in the initial group. Next, the support bit vector for the "center" property in the group (or cumulative set of properties in the group) is hashed to an integer value at block 204. In some embodiments of the present invention, a Murmur3 algorithm is used to hash the bit vectors. Groups for which the bit vector hashes to the same integer value, and further which have identical bit vectors, are then merged at block 206. Any property in the merged group can subsequently be chosen as the new "center" property.

Every support variable is uniquely indexed in the support bit vector for each property. Every SCC has an associated weight that equals the number of support registers in that SCC. In some embodiments of the present invention, the netlist contains at least one very large SCC, comprising the majority of its registers. For this netlist, all properties that contain the same heavy-weight SCCs in the "cone of influence" can be grouped together as having high affinity.

Figure 7:
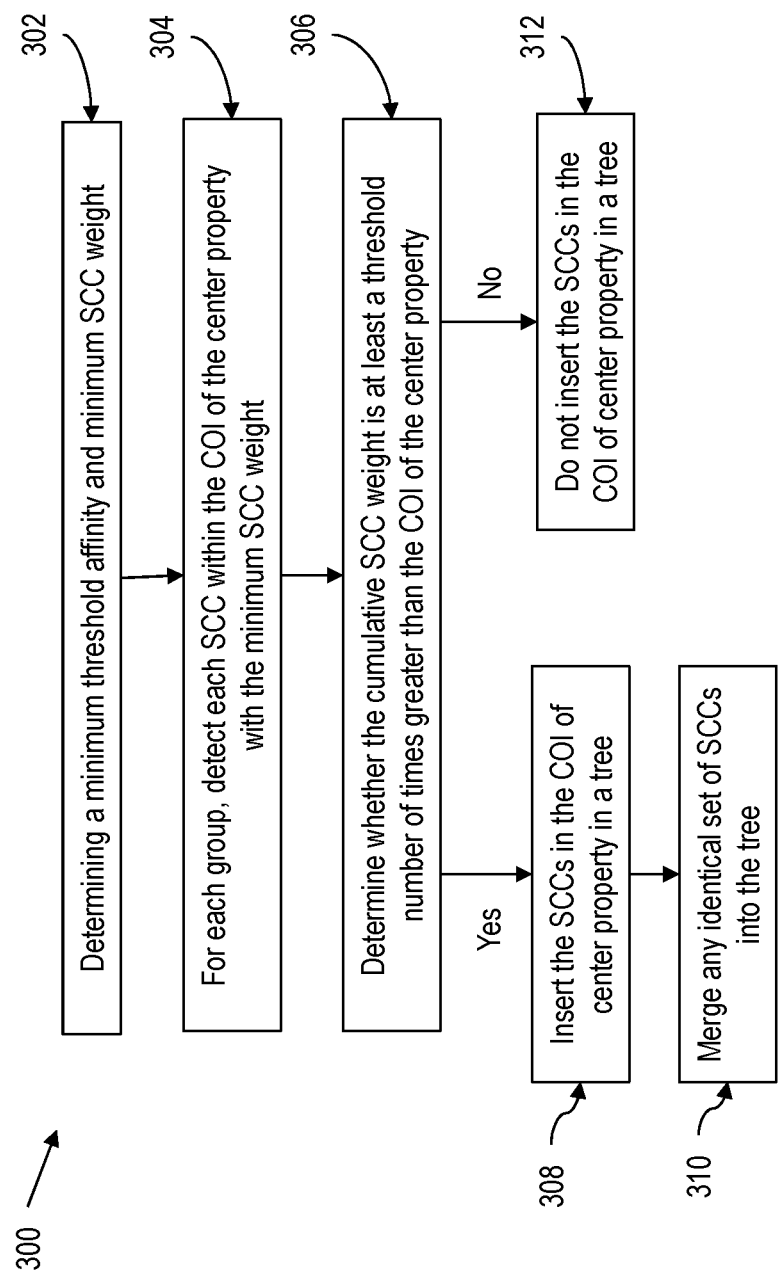
FIG. 7 depicts a flow diagram for level two grouping according to one or more embodiments of the present invention.

Referring to FIG. 7 a method 300 for performing level 2 property grouping based on heavy-weight SCCs is shown. FIG. 8 is pseudocode describing level 2 grouping and accompanies FIG. 7. The procedure takes as input a threshold t representing the desired minimum affinity, along with a minimum SCC weight to consider at block 302. For every group, find all SCCs in the "cone of influence" of the "center" property, with the minimum SCC weight at block 304. If the cumulative SCC weight is at least t times the fan-in logic size of the "center" property, the set of SCCs is inserted into a prefix tree or trie at block 308. If the trie already contains this set of SCCs, albeit for another group, the two groups are merged at block 310. Any property in the merged group can be subsequently chosen as the new "center" property since all properties are within the desired affinity threshold. If the cumulative SCC weight is not at least t times the fan-in logic size of the "center" property, the set of SCCs is not inserted into a prefix tree or trie at block 312.

In practice, many netlists contain one or more very large SCCs comprising a substantial percentage of its support variables. Properties sharing a small number of common large SCCs may thus be adequately high-affinity to group based solely upon analysis of these SCCs, without needing to consider a potentially very large number of unit-weight non-SCC support variables or smaller SCCs. In contrast, storing every full bit vector in a trie may become computationally expensive and serve little benefit. Since the subsequent level 3 grouping does take individual unit weight support indices into account, in some embodiments of the present invention, the minimum SCC weight is set to at least 1% of the total number of bit vector indices in the netlist, and in other embodiments of the present invention, up to 10% of the total number.

In practice, it is desirable to perform additional grouping of high-affinity properties which have a small configurable Hamming distance yet are still high-affinity. However, the conventional methods of a pairwise comparison of properties checking for those within a small tolerance are prohibitively slow, rendering it undesirable in practice. The following methods address these issues by providing high-affinity group merging with high scalability using an approximation to determine the Hamming distance rather than directly computing the Hamming distance.

Conventional clustering techniques based on a distance metric are slow and do not scale well with the number of clustered items. They require expensive computation of a distance matrix that maintains the distance between every pair of items (guaranteed to require at least quadratic resources), and the number of clusters to generate as an input parameter. In a verification context, it is prohibitively slow to perform a quadratic number of bit vector comparisons. Additionally, it is not possible to a priori know how many high-affinity groups are a natural fit for the given multi-property netlist, until the affinity analysis and grouping are completed. Classical clustering algorithms are thus unsuitable for our goal.

Figure 9:
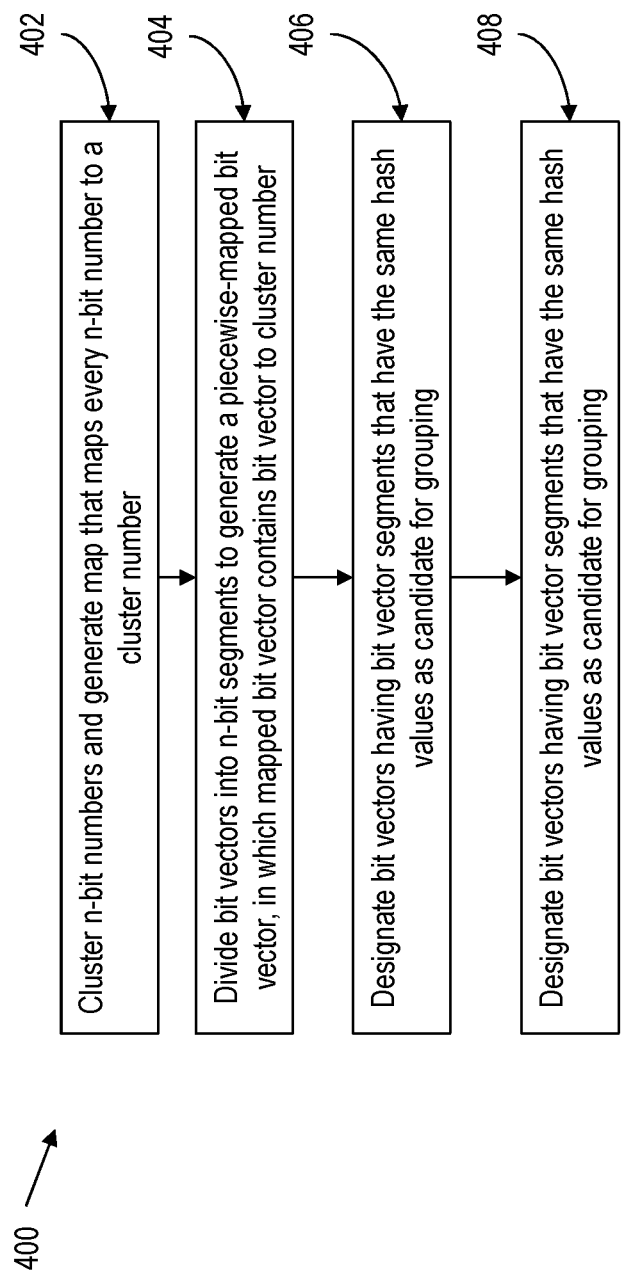
FIG. 9 depicts a flow diagram for a clustering method according to one or more embodiments of the present invention.

Embodiments of the present invention provide an approximate clustering method to scalable cluster bit vectors based on Hamming distance. Referring to FIG. 9 the clustering method 400 used to approximate computation of Hamming distance is shown. FIG. 10 is pseudocode describing the clustering method and accompanies FIG. 10. As an initialization step, the algorithm first clusters all n-bit numbers into "num" centers; a map m is maintained that maps every n-bit number (0, 1, ..., $2^n-1$) to the allotted cluster center (1, ..., num) at block 402. The initialization step involving clustering does not hinder scalability as this map can be computed once offline, and reused in all future runs of the algorithm (e.g. embedded into a verification tool).

Every bit vector is then read in n-bit segments to generate a piecewise-mapped bit vector using map m at block 404. A hashing operation is performed on each mapped bit vector at block 406. Bit vectors for which the corresponding mapped bit vectors hash to the same value are put in the same cluster, as candidates for grouping at block 408. The number of bits and centers can be adjusted to vary the quality of clustering, i.e. the maximum Hamming distance allowed per n-bit segment. The maximum distance between clustered bit vectors is at most the number of words times twice the per-n-bit segment Hamming distance. Since large SCCs are typically treated separately, this computation typically ignores segments referring to large SCCs taken into account in level 2 grouping. For non-unit-weight segments, a higher-granularity mapping can be used to separate the large SCCs if desired.

Figure 11:
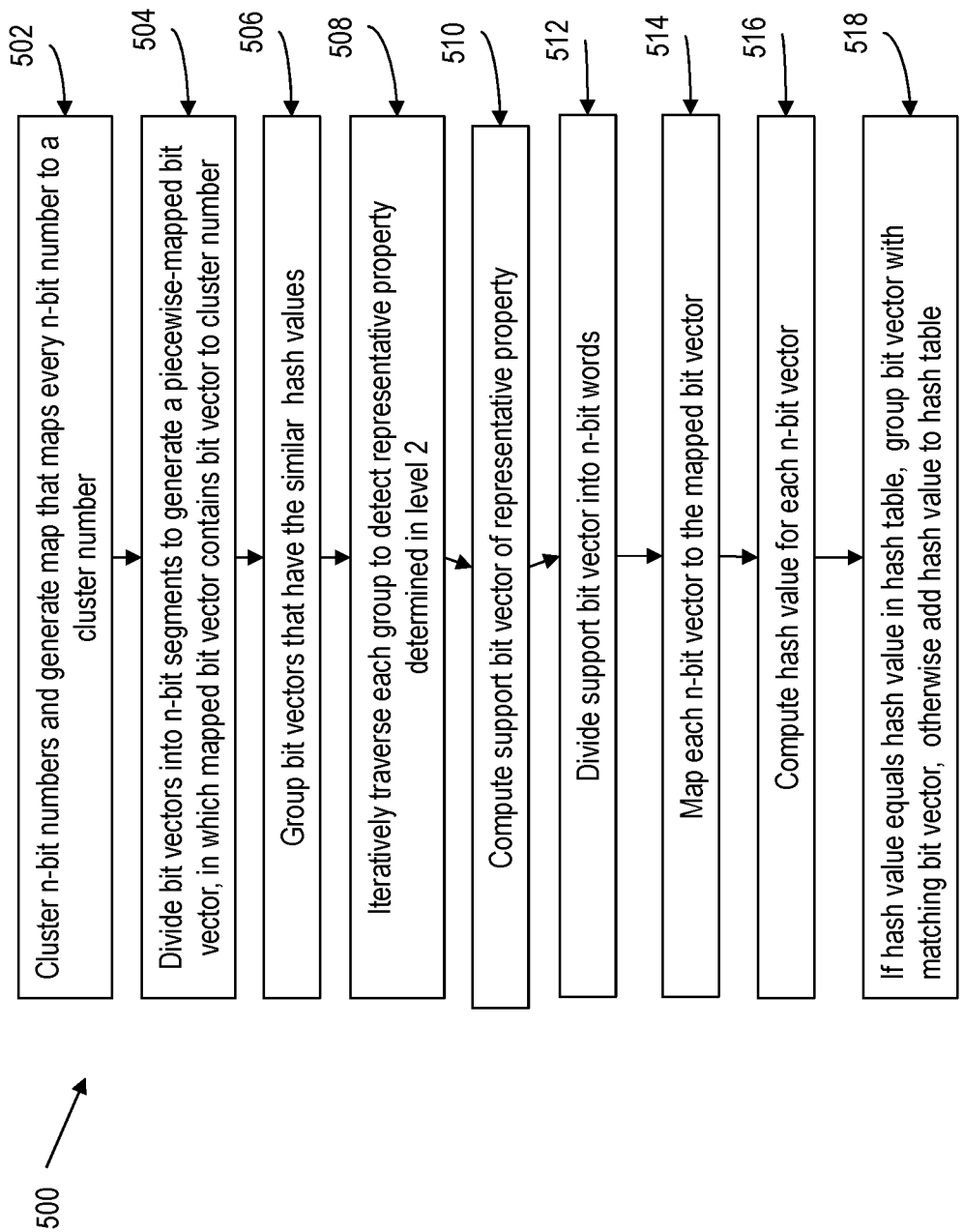
FIG. 11 depicts a flow diagram for level three grouping according to one or more embodiments of the present invention.

Referring to FIG. 11 method 500 for level 3 grouping is shown. FIG. 2 is pseudocode describing the level 3 grouping method and accompanies FIG. 11. The following example is provided to demonstrate the method to perform property grouping based on Hamming distance using the fuzzed bit vector clustering algorithm of FIG. 9. In some embodiments of the present invention, a Gonzales clustering algorithm, in which n=16 and num=500 for a per-segment Hamming distance of 1 and an affinity threshold of t=0.9 for grouped bit vectors. A 16-bit segment Hamming distance of 1 ensures that two 16-bit numbers in a cluster will have at least 14 bits identical for a minimum 0.875 affinity, and in turn, the grouped bit vector will also have a minimum 0.875 affinity. These values for n and num are determined experimentally and can be varied to match the desired affinity threshold. A map is generated of all n-bit numbers to cluster centers (1, ..., num) at block 502. The "center" property bit vector for every group is read per n-bit segment, to generate a mapped bit vector using map m at block 504. The mapped bit vector is hashed to an integer value. The groups for which the "center" property mapped bit vectors hash to the same value are immediately merged at block 506.

Each group is traversed to detect representative property determined in the level 2 grouping step at block 508. The support bit vector of representative property is either computed or detected at block 510. The support bit vector is divided into n-bit words at block 512. Each n-bit vector is mapped to the mapped bit vector at block 514. A hash value is computed for each n-bit vector at block 516. The computed hash values are compared to hash values in a hash table. If hash value equals the hash value in a hash table, merge the current group with the group corresponding to the hash value in the hash table, otherwise add hash value to a hash table at block 518.

There is some asymmetry in this approach, in that two fairly-high-affinity bit vectors which differ too much in a single segment will not be merged, whereas if the difference was small per segment with multiple segments differentiated, they may be merged. Nonetheless, as the highly-scalable grouping within a tolerance save cumulative verification resources, in some embodiments of the present invention, the level 3 grouping has no additional postprocessing.

If higher precision and symmetry is desired, two additional components can be included. The first is the "optional post-processing" step. This step leverages a trie to store the mapped bit vectors, with a branch-and-bound traversal that can search for other mapped bit vectors similar within a certain threshold of differentiating by at most a few n-bit segments, to better group fairly-high-affinity mismatches from the earlier levels. Other data structures such as minimal acyclic finite state automaton (MA-FSA) can also be used instead of a trie, if desired. The variable 'allowed_to_differ' in FIG. 12 is the maximum number of segments allowed to differ across mapped bit vectors to maintain the desired affinity threshold. The function trie_query(trie, mbv, allowed_to_differ) in FIG. 12 is implementation-dependent and not claimed. It performs pattern matching on strings and returns all groups for which the mapped support bit vectors differ by only 'allowed_to_differ' segments with respect to mbv from FIG. 12.

A second mechanism to heuristically improve precision is simply to repeat the highly-scalable analysis. This can be done either as-is on the entire netlist under different permutations or segment-partitioning of bit vector index assignments (i.e., by varying the starting index of the first n-bit segment in the bit vector), or on individual (sets of) groups obtained from the prior run. Since re-running on a *subset* of properties implies a smaller cone-of-influence, bit vector index assignments can be compacted for faster runtime to only include support variables in the fan-in logic of any considered property, and this indexing will differ from the prior run over a larger set of properties. A related idea is that support variables present in every property under consideration can be completely projected out of the bit vectors (or treated as a single non-unit-weight SCC) to offer further compaction and speedup. Computing the set of support variables present in every bit vector can be accomplished with a linear time bit vector conjunction sweep over those bit vectors, hence is very scalable.

Figure 13:
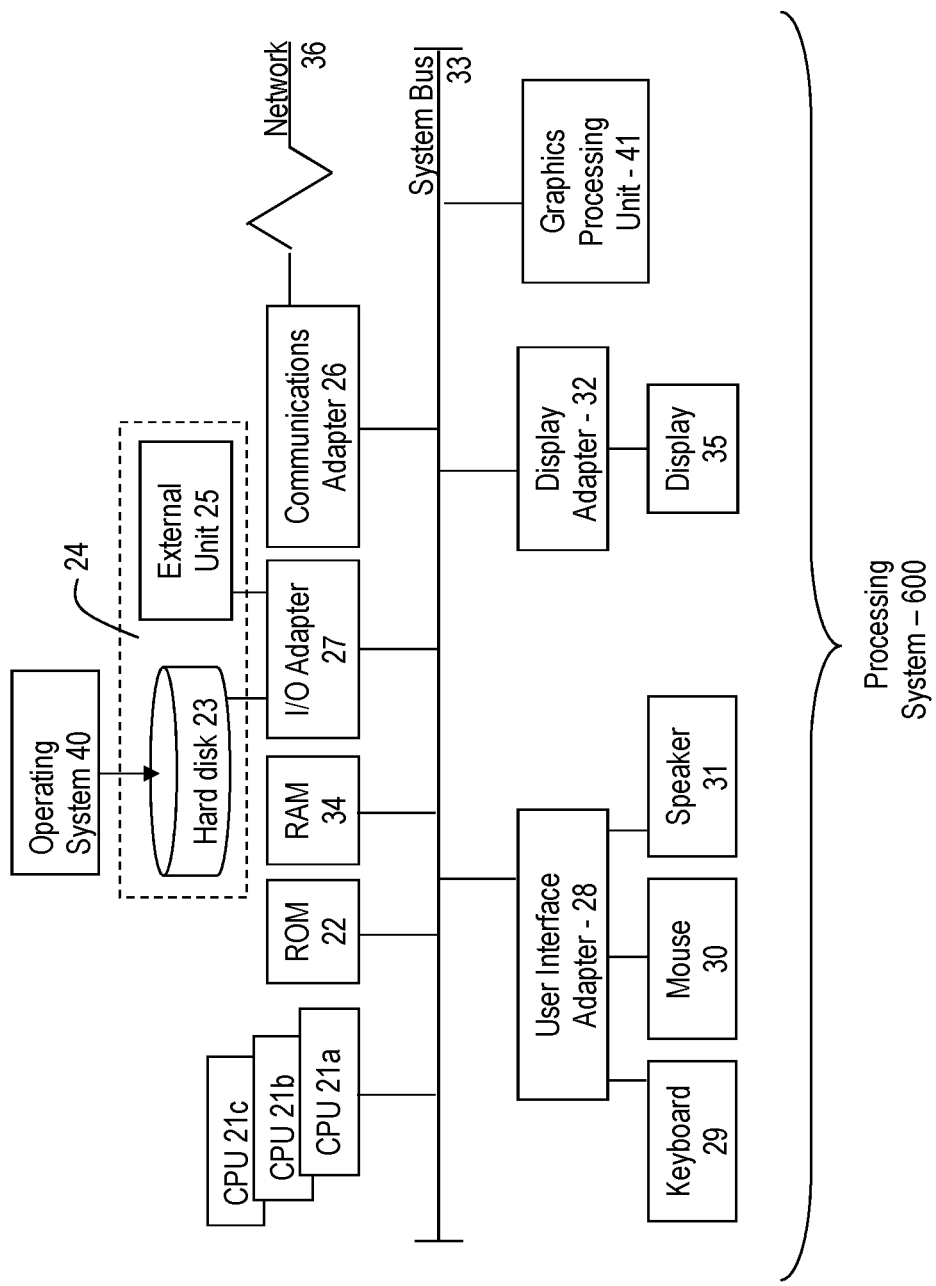
FIG. 13 depicts a block diagram of a computer system for use in implementing one or more embodiments of the present invention.

Referring to FIG. 13, there is shown an embodiment of a processing system 600 for implementing the teachings herein. In this embodiment, the system 600 has one or more central processing units (processors) 21a, 21b, 21c, etc. (collectively or generically referred to as processor(s) 21). In one or more embodiments, each processor 21 may include a reduced instruction set computer (RISC) microprocessor. Processors 21 are coupled to system memory 34 and various other components via a system bus 33. Read only memory (ROM) 22 is coupled to the system bus 33 and may include a basic input/output system (BIOS), which controls certain basic functions of system 600.

FIG. 13 further depicts an input/output (I/O) adapter 27 and a network adapter 26 coupled to the system bus 33. I/O adapter 27 may be a small computer system interface (SCSI) adapter that communicates with a hard disk 23 and/or external storage drive 25 or any other similar component. I/O adapter 27, hard disk 23, and external storage device 25 are collectively referred to herein as mass storage 24. Operating system 40 for execution on the processing system 600 may be stored in mass storage 24. A network adapter 26 interconnects bus 33 with an outside network 36 enabling data processing system 600 to communicate with other such systems. A screen (e.g., a display monitor) 35 is connected to system bus 33 by display adaptor 32, which may include a graphics adapter to improve the performance of graphics intensive applications and a video controller. In one embodiment, adapters 27, 26, and 32 may be connected to one or more I/O busses that are connected to system bus 33 via an intermediate bus bridge (not shown). Suitable I/O buses for connecting peripheral devices such as hard disk controllers, network adapters, and graphics adapters typically include common protocols, such as the Peripheral Component Interconnect (PCI). Additional input/output devices are shown as connected to system bus 33 via user interface adapter 28 and display adapter 32. A keyboard 29, mouse 30, and speaker 31 all interconnected to bus 33 via user interface adapter 28, which may include, for example, a Super I/O chip integrating multiple device adapters into a single integrated circuit.

In exemplary embodiments, the processing system 600 includes a graphics processing unit 41. Graphics processing unit 41 is a specialized electronic circuit designed to manipulate and alter memory to accelerate the creation of images in a frame buffer intended for output to a display. In general, graphics processing unit 41 is very efficient at manipulating computer graphics and image processing and has a highly parallel structure that makes it more effective than general-purpose CPUs for algorithms where processing of large blocks of data is done in parallel.

Thus, as configured in FIG. 13, the system 600 includes processing capability in the form of processors 21, storage capability including system memory 34 and mass storage 24, input means such as keyboard 29 and mouse 30, and output capability including speaker 31 and display 35. In one embodiment, a portion of system memory 34 and mass storage 24 collectively store an operating system coordinate the functions of the various components shown in FIG. 13.

Additional processes may also be included. It should be understood that the processes depicted in FIG. 1-FIG. 12 represent illustrations, and that other processes may be added or existing processes may be removed, modified, or rearranged without departing from the scope and spirit of the present disclosure.

Various embodiments of the invention are described herein with reference to the related drawings. Alternative embodiments of the invention can be devised without departing from the scope of this invention. Various connections and positional relationships (e.g., over, below, adjacent, etc.) are set forth between elements in the following description and in the drawings. These connections and/or positional relationships, unless specified otherwise, can be direct or indirect, and the present invention is not intended to be limiting in this respect. Accordingly, a coupling of entities can refer to either a direct or an indirect coupling, and a positional relationship between entities can be a direct or indirect positional relationship. Moreover, the various tasks and process steps described herein can be incorporated into a more comprehensive procedure or process having additional steps or functionality not described in detail herein.

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" may be understood to include any integer number greater than or equal to one, i.e. one, two, three, four, etc. The terms "a plurality" may be understood to include any integer number greater than or equal to two, i.e.

two, three, four, five, etc. The term "connection" may include both an indirect "connection" and a direct "connection."

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

For the sake of brevity, conventional techniques related to making and using aspects of the invention may or may not be described in detail herein. In particular, various aspects of computing systems and specific computer programs to implement the various technical features described herein are well known. Accordingly, in the interest of brevity, many conventional implementation details are only mentioned briefly herein or are omitted entirely without providing the well-known system and/or process details.

The present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instruction by utilizing state information of the computer readable program instructions to personalize the electronic circuitry, to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A computer-implemented method for partitioning a netlist into grouped observable gates, the method comprising:

obtaining a netlist of a circuit comprising a plurality of observable gates;

grouping together a first observable gate and a second observable gate based on a portion of a fan-in logic of the first observable gate being equal to a portion of a fan-in logic of the second observable gate;

expanding the group to include a third observable gate, based on a first strongly connected component (SCC) in the group having a similarity greater than a first threshold to a second SCC in the fan-in logic of the third observable gate;

further expanding the group to include a fourth observable gate, based on the distance of a portion of the fan-in logic of the fourth observable gate from a fan-in logic of at least one observable gate in the group of observable gates; and verifying the further expanded group of the circuit, wherein an observable gate is a property to be verified, and wherein the further expanded group is verified independently from any other group of the circuit.

2. The computer-implemented method of claim 1, wherein determining the first similarity comprises:

generating a first bit vector to represent the fan-in logic of the first observable gate, wherein each bit in the first bit vector is indexed to a respective position of a node of the fan-in logic of the first observable gate;

assigning a valid bit to each bit in the first bit vector indexed to a respective node comprising a support variable;

generating a second bit vector to represent the fan-in logic of the second observable gate, wherein each bit in the second bit vector is indexed to a respective position of a node of the fan-in logic of the second observable gate;

assigning a valid bit to each bit in the second bit vector indexed to a respective node comprising a support variable; and determining whether the first bit vector is equal to the second bit vector.

3. The computer-implemented method of claim 2 further comprising:

generating a respective hash value for the first bit vector and the second bit vector; and determining whether the first bit vector is equal to the second bit vector based on the respective hash values and a comparison of the first bit vector and the second bit vector.

4. The computer-implemented method of claim 2, wherein determining the distance comprises:

generating a third bit vector to represent the fan-in logic of the fourth observable gate, wherein each bit in the third bit vector is indexed to a respective position of a node of the fan-in logic of the third observable gate;

assigning a valid bit to each bit in the third bit vector indexed to a respective node comprising a support variable;

converting the first bit vector and third bit vector to a respective mapped first bit vector and mapped second bit vector using a mapping sequence; and determining whether the mapped first bit vector is equal to the second mapped bit vector based on a hash value of the mapped first bit vector and a hash value of the second mapped bit vector.

5. The computer-implemented method of claim 1, wherein determining the similarity between the first SCC and the second SCC comprises:

weighting a value of the first SCC based on a count and a position of each register in the first SCC;

weighting a value of the second SCC based on a count and a position of each register in the second SCC; and determining whether the first SCC and second SCC have a weighted value within a second threshold of a size of the netlist.

6. The computer-implemented method of claim 1, wherein an observable gate is an endpoint for logic synthesis, and wherein the further expanded group is synthesized independently from any other group of the circuit.

7. A system for partitioning a netlist into grouped observable gates, the system comprising:

a memory having computer readable instructions; and one or more processors for executing the computer readable instructions, the computer readable instructions controlling the one or more processors to perform operations comprising:

obtaining a netlist of a circuit comprising a plurality of observable gates;

grouping together a first observable gate and a second observable gate based on a portion of a fan-in logic of the first observable gate being equal to a portion of a fan-in logic of the second observable gate;

expanding the group to include a third observable gate, based on a first strongly connected component (SCC) in the group having a similarity greater than a first threshold to a second SCC in the fan-in logic of the third observable gate;

further expanding the group to include a fourth observable gate, based on the distance of a portion of a fan-in logic of the fourth observable gate from a portion of a fan-in logic of at least one observable gate in the group of observable gates; and verifying the further expanded group of the circuit, wherein an observable gate is a property to be verified, and wherein the further expanded group is verified independently from any other group of the circuit.

8. The system of claim 7, wherein determining the first similarity comprises:

generating a first bit vector to represent the logic gate sequence of the first observable gate, wherein each bit in the bit vector is indexed to a respective position of a logic gate along the logic gate sequence of the first observable gate;

assigning a valid bit to each bit in the first bit vector in which the respective logic gate includes either a register or an input;

generating a second bit vector to represent the logic gate sequence of the second observable gate, wherein each bit in the bit vector is indexed to a respective position of a logic gate along the logic gate sequence of the second observable gate;

assigning a valid bit to each bit in the second bit vector in which the respective logic gate includes either a register or an input; and determining whether the first bit vector is equal to the second bit vector.

9. The system of claim 8 the operations further comprising:

generating a respective hash value for the first bit vector and the second bit vector; and determining whether the first bit vector is equal to the second bit vector based on the respective hash values and a comparison of the first bit vector and the second bit vector.

10. The system of claim 8, wherein determining the distance comprises:

generating a third bit vector to represent the fan-in logic of the fourth observable gate, wherein each bit in the third bit vector is indexed to a respective position of a node of the fan-in logic of the third observable gate;

assigning a valid bit to each bit in the third bit vector indexed to a respective node comprising a support variable;

converting the first bit vector and third bit vector to a respective mapped first bit vector and a mapped second bit vector using a mapping sequence; and determining whether the mapped first bit vector is equal to the second mapped bit vector, based on a hash value of the mapped first bit vector and a hash value of the second mapped bit vector.

11. The system of claim 7, wherein determining the similarity comprises:

weighting a value of the first SCC based on a count and a position of each register in the first SCC;

weighting a value of the second SCC based on a count and a position of each register in the second SCC; and determining whether the first SCC and second SCC have a weighted value within a second threshold of a size of the netlist.

12. The system of claim 7, wherein an observable gate is an endpoint for logic synthesis, and wherein the further expanded group is synthesized independently from any other group of the circuit.

13. A computer program product for partitioning a netlist into grouped observable gates, the computer program product comprising a computer readable storage medium having program instructions embodied therewith, the program instructions executable by a processor to cause the processor to perform operations comprising:

obtaining a netlist of a circuit comprising a plurality of observable gates;

grouping together a first observable gate and a second observable gate based on a portion of a fan-in logic of the first observable gate being equal to a portion of a fan-in logic of the second observable gate;

expanding the group to include a third observable gate, based on a first strongly connected component (SCC) in the group having a similarity greater than a first threshold to a second SCC in the fan-in logic of the third observable gate;

further expanding the group to include a fourth observable gate, based on the distance of a portion of a fan-in logic of the fourth observable gate from a portion of a fan-in logic of at least one observable gate in the group of observable gates; and verifying the further expanded group of the circuit, wherein an observable gate is a property to be verified, and wherein the further expanded group is verified independently from any other group of the circuit.

14. The computer program product of claim 13, wherein determining the first similarity comprises:

generating a first bit vector to represent the fan-in logic of the first observable gate, wherein each bit in the first bit vector is indexed to a respective position of a node of the fan-in logic of the first observable gate;

assigning a valid bit to each bit in the first bit vector in which the respective node comprises a support variable;

generating a second bit vector to represent the fan-in logic of the second observable gate, wherein each bit in the second bit vector is indexed to a respective position of a node of the fan-in logic of the second observable gate;

assigning a valid bit to each bit in the second bit vector in which the respective node comprises a support variable; and determining whether the first bit vector is identical to the second bit vector.

15. The computer program product of claim 14, wherein determining the distance comprises:

generating a third bit vector to represent the fan-in logic of the fourth observable gate, wherein each bit in the third bit vector is indexed to a respective position of a node of the fan-in logic of the third observable gate;

assigning a valid bit to each bit in the third bit vector indexed to a respective node comprising a support variable;

converting the first bit vector and third bit vector to a respective mapped first bit vector and a mapped second bit vector using a mapping sequence; and determining whether the mapped first bit vector is equal to the mapped third bit vector based on a hash value of the mapped first bit vector and a hash value of the mapped second bit vector.

16. The computer program product of claim 13 further comprising:

generating a respective hash value for the first bit vector and the second bit vector; and determining whether the first bit vector is equal to the second bit vector based on the respective hash values.

17. The computer program product of claim 13, wherein determining the similarity comprises:

weighting a value of the first SCC based on a count and a position of each register in the first SCC;

weighting a value of the second SCC based on a count and a position of each register in the second SCC; and determining whether the first SCC and second SCC have a weighted value within a second threshold of a size of the netlist.

18. The computer program product of claim 13, wherein an observable gate is an endpoint for logic synthesis, and wherein the further expanded group is synthesized independently from any other group of the circuit.

\* \* \* \* \*